(12) United States Patent
Ziglioli et al.

(10) Patent No.: US 11,842,954 B2
(45) Date of Patent: Dec. 12, 2023

(54) METHOD OF MANUFACTURING SEMICONDUCTOR DEVICES AND CORRESPONDING SEMICONDUCTOR DEVICE

(71) Applicant: STMicroelectronics S.r.l., Agrate Brianza (IT)

(72) Inventors: Federico Giovanni Ziglioli, Pozzo D'Adda (IT); Alberto Pintus, Gessate (IT); Pierangelo Magni, Villasanta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/887,838

(22) Filed: Aug. 15, 2022

(65) Prior Publication Data
US 2022/0392830 A1 Dec. 8, 2022

Related U.S. Application Data

(62) Division of application No. 17/108,270, filed on Dec. 1, 2020, now Pat. No. 11,417,590.

(30) Foreign Application Priority Data

Dec. 2, 2019 (IT) .......................... 102019000022632

(51) Int. Cl.
*H01L 23/495* (2006.01)
*H01L 21/48* (2006.01)
*H01L 21/56* (2006.01)

(52) U.S. Cl.
CPC ...... *H01L 23/49586* (2013.01); *H01L 21/481* (2013.01); *H01L 21/4825* (2013.01); *H01L 21/565* (2013.01); *H01L 23/49506* (2013.01)

(58) Field of Classification Search
CPC .................... H01L 23/49586; H01L 23/49506
See application file for complete search history.

(56) References Cited

U.S. PATENT DOCUMENTS

| | | |
|---|---|---|
| 2001/0051397 A1 | 12/2001 | Jiang et al. |
| 2007/0080439 A1 | 4/2007 | Kikuchi et al. |
| 2007/0108598 A1* | 5/2007 | Zhong ................. H01L 23/3128 257/E23.092 |
| 2009/0152665 A1* | 6/2009 | Tseng .................... H01L 25/167 438/73 |
| 2010/0071940 A1 | 3/2010 | Ejiri et al. |
| 2012/0305771 A1 | 12/2012 | Lai |
| 2019/0043794 A1 | 2/2019 | Kapusta et al. |

OTHER PUBLICATIONS

IT Search Report and Written Opinion for IT Appl. No. 102019000022632 dated Jul. 24, 2020 (8 pages).

* cited by examiner

*Primary Examiner* — Peniel M Gumedzoe
(74) *Attorney, Agent, or Firm* — CROWE & DUNLEVY

(57) ABSTRACT

A plastic material substrate has a die mounting location for a semiconductor die. Metallic traces are formed on selected areas of the plastic material substrate, wherein the metallic traces provide electrically-conductive paths for coupling to the semiconductor die. The semiconductor die is attached onto the die mounting location. The semiconductor die attached onto the die mounting location is electrically bonded to selected ones of the metallic traces formed on the plastic material substrate. A package material is molded onto the semiconductor die attached onto the die mounting location.

13 Claims, 3 Drawing Sheets

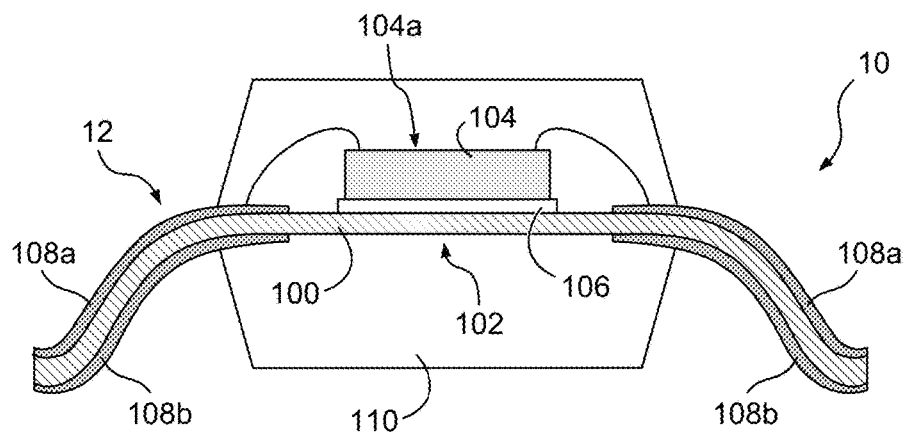
FIG. 1
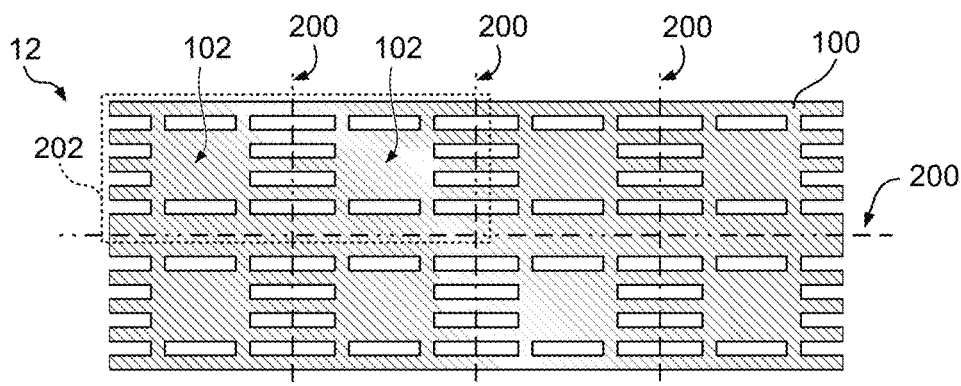
FIG. 2A
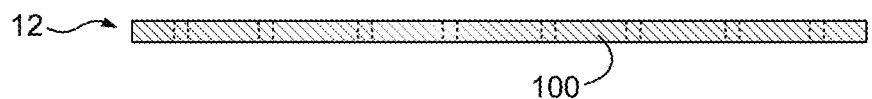
FIG. 2B
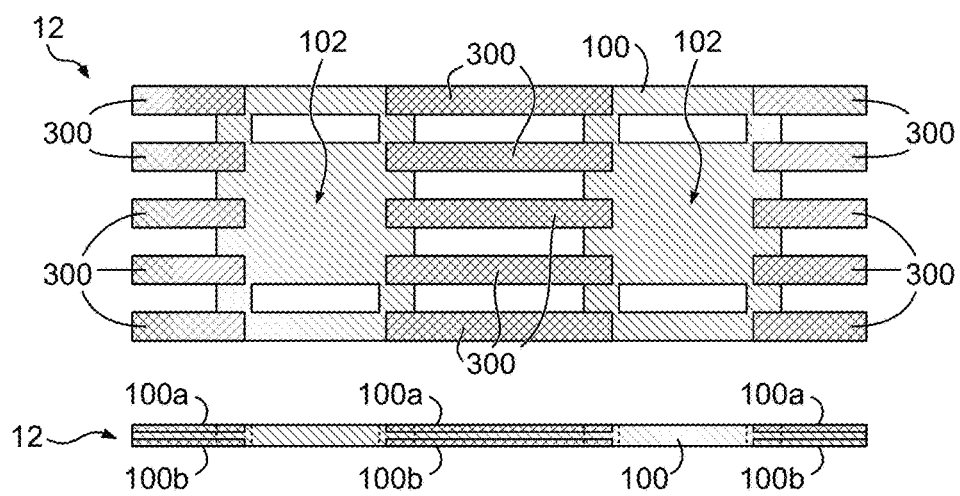
FIG. 3A
FIG. 3B

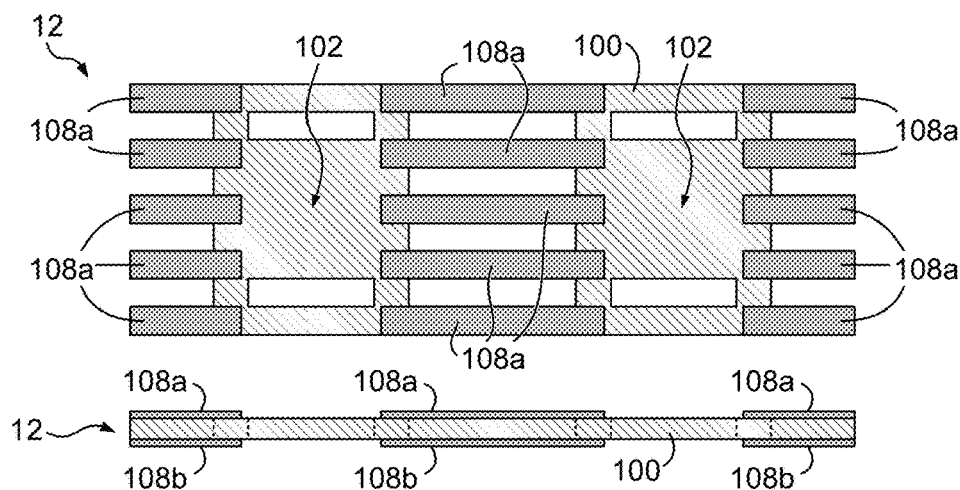
FIG. 4A
FIG. 4B
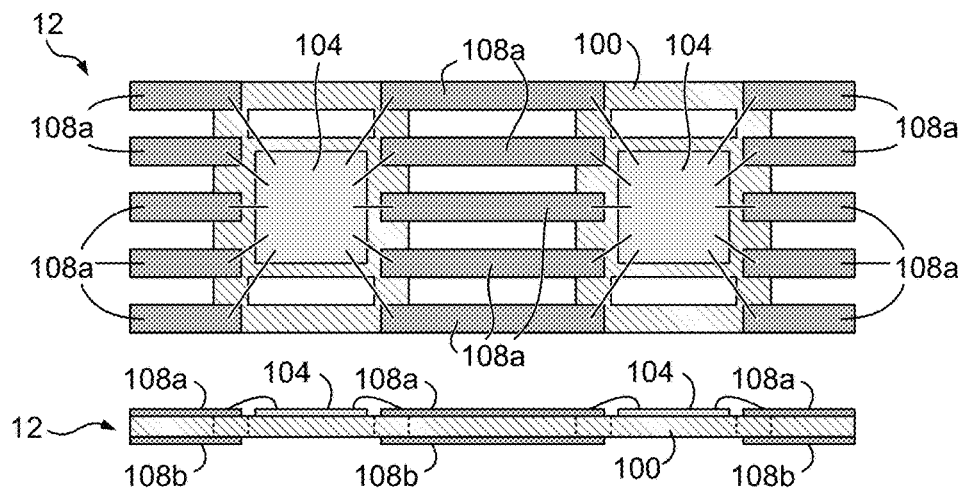
FIG. 5A
FIG. 5B
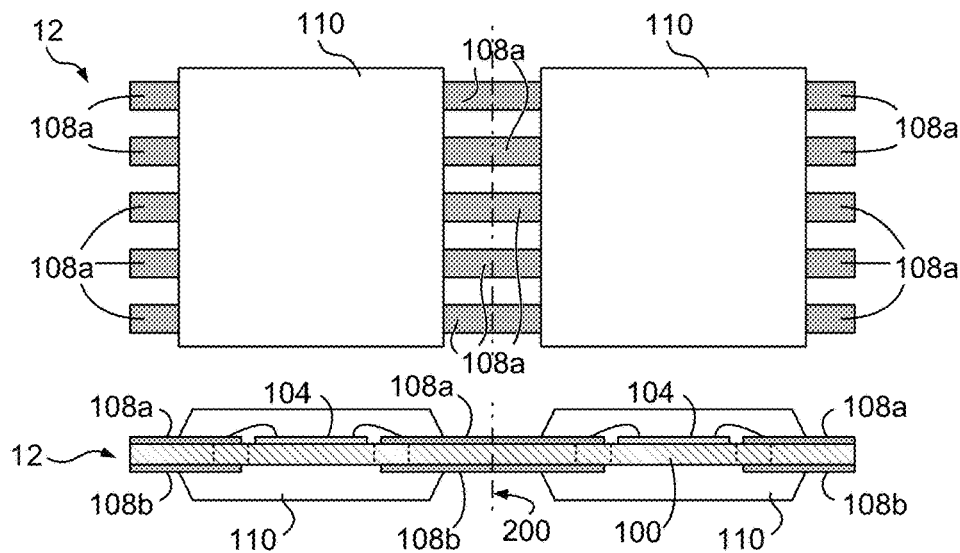
FIG. 6A
FIG. 6B

METHOD OF MANUFACTURING SEMICONDUCTOR DEVICES AND CORRESPONDING SEMICONDUCTOR DEVICE

CROSS REFERENCE TO RELATED APPLICATIONS

This application is a divisional of U.S. patent application Ser. No. 17/108,270, filed Dec. 1, 2020, now U.S. Pat. No. 11,417,590, which claims the priority benefit of Italian Application for Patent No. 102019000022632, filed on Dec. 2, 2019, the contents of which are hereby incorporated by reference in their entireties to the maximum extent allowable by law.

TECHNICAL FIELD

The description relates to manufacturing semiconductor devices.

One or more embodiments may be applied to manufacturing integrated circuits (ICs).

BACKGROUND

Various technologies are currently available for manufacturing semiconductor devices such as integrated circuits.

Desirable features in that technical field may include reduced assembly cost, possibility of replacing the leadframe with a custom-made substrate, high flexibility in substrate manufacturing, modular configuration for multiple dice, and capability of possibly dispensing with wire bonding.

There is a need in the art to contribute in providing further improvements along the lines discussed in the foregoing.

SUMMARY

One or more embodiments may relate to a method.

One or more embodiments may relate to a corresponding semiconductor device (an integrated circuit, for instance).

One or more embodiments may provide a method of manufacturing semiconductor devices, such as integrated circuits, comprising providing a leadframe having a core or substrate comprising plastic material and selective surface metallization at the leads area.

One or more embodiments may comprise providing plastic material suitable for laser direct structuring (LDS) in the plastic core or substrate of the leadframe.

One or more embodiments may thus facilitate replacing a metallic leadframe with a less expensive plastic leadframe, providing improved flexibility of routing to simplify wire bonding inside the body of the package, and providing low cost packages for integrated circuits.

BRIEF DESCRIPTION OF THE DRAWINGS

One or more embodiments will now be described, by way of example only, with reference to the annexed figures, wherein:

FIG. 1 is a cross-sectional view across a semiconductor device according to embodiments, FIGS. 2A to 6B are exemplary of possible manufacturing steps according to embodiments.

DETAILED DESCRIPTION

Figure 7:
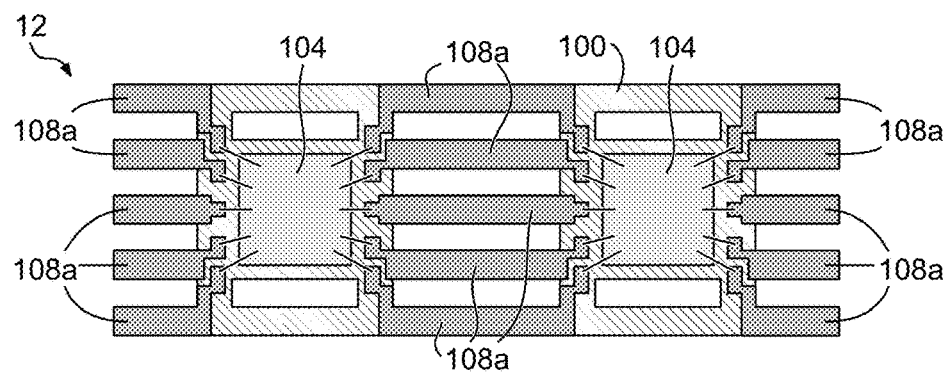
FIG. 7 is a plan view of certain elements of a semiconductor device exemplary of embodiments.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, like parts or elements are indicated with like references/numerals and a corresponding description will not be repeated for brevity.

It will be appreciated that, for the sake of clarity and ease of representation, the various Figures may not be drawn to scale and may not be drawn all to the same scale.

The references used herein are provided merely for convenience and hence do not define the extent of protection or the scope of the embodiments.

Laser Direct Structuring (LDS) is a laser-based machining technique now widely used in various sectors of the industrial and consumer electronics markets, for instance for high-performance antenna integration, where an antenna design can be directly formed onto a molded plastic part.

In an exemplary process, the molded parts can be produced with commercially available resins which include additives suitable for the LDS process. A broad range of resins such as polymer resins like Polycarbonate (PC), Polycarbonate/Acrylonitrile Butadiene Styrene (PC/ABS), ABS, Liquid Crystal Polymer (LCP) are currently available for that purpose.

In LDS, a laser beam can be used to transfer a desired electrically-conductive pattern onto a plastic material which may then be subjected to metallization (for instance via electroless plating with copper or other metals) to finalize a desired conductive pattern. Electroless plating may be followed by an electrolytic deposition of copper or other metals, e.g., to increase the thickness of the conductive pattern to a certain (e.g., defined) value.

One or more embodiments as exemplified herein are based on the recognition that LDS facilitates providing electrically-conductive formations such as vias and lines in a plastic (molding) compound, without additional manufacturing steps and with a high flexibility in the shapes which can be obtained.

One or more embodiments may facilitate providing semiconductor devices which include a leadframe comprising plastic material.

The designation "leadframe" (or "lead frame") is currently used (see, for instance, the Consolidated Glossary of USPC Terms of the United States Patent and Trademark Office) to indicate a metal frame which provides support for an integrated circuit chip or die as well as electrical leads to interconnect the integrated circuit in the die or chip to other electrical components or contacts.

Essentially, a lead frame comprises an array of electrically-conductive formations (leads) which, from an outline location, extend inwardly in the direction of a semiconductor chip or die thus forming an array of electrically-conductive formations from a die pad configured to have at least one semiconductor chip or die attached thereon.

FIG. 1 is a cross-sectional view across an integrated circuit 10 according to one or more embodiments. The integrated circuit 10 comprises a foil 100 of plastic (e.g., polymeric) material which provides a core or substrate of a leadframe 12. The plastic material may comprise a material suitable for LDS processing, such as Liquid Crystal Polymer (LCP), polytetrafluoroethylene (PTFE), or a thermo-setting resin (epoxy cresol novaolac—ECN, Biphenyl, dycyclopentadiene—DCP, Multi-aromatic).

A (e.g., central) portion 102 of the leadframe 12 may be configured as a die pad location to host a die or dice 104 attached on the leadframe 12 via die attach material 106, e.g., an epoxy glue containing silver (Ag) or a film containing silver.

Electrically-conductive formations (i.e., the leads of the leadframe 12) are provided on the plastic foil 100 by forming (e.g., plating, for instance via electroless plating possibly followed by electrolytic deposition) metal layers 108a, 108b on selected portions of the plastic foil 100. For instance, a metal layer 108a may be formed on (part of) the front (e.g., top) surface of the foil 100, and/or a metal layer 108b may be formed on (part of) the rear (e.g., bottom) surface of the foil 100.

The metal layer 108a and/or 108b may comprise at least one metal selected out of copper (Cu), silver (Ag), aluminum (Al), nickel (Ni), palladium (Pd), gold (Au).

The die 104 may be electrically coupled to the leads of the leadframe 12 by means of bonding wires (or any other type of inter-connections like, for instance, copper bumps or solder bumps) coupling the die pads provided on the front surface 104a of the die 104 to electrically-conductive formations provided, e.g., in the metal layer 108a.

The integrated circuit 10 may also comprise a package 110 comprising, e.g., a molding compound such as epoxy molding compound (EMC) which encapsulates the die 104, the bonding wires and a portion of the leadframe 12. Portions of the plastic foil 100 with metal layer 108a and/or 108b laterally extend out (i.e., externally) from a peripheral side of the package 110 to form external leads.

In one or more embodiments, the thickness of the plastic foil 100 may be in the range of about 80 μm to 150 μm.

In one or more embodiments, the thickness of the metal layers 108a, 108b may be in the range of about 50 μm to 150 μm.

For Thin Quad Flat Packages (TQFP), the thickness of the metal layers 108a, 108b may be in the range of about 5 mils to 6 mils (1 mil=0.001 in=25.4 μm).

The thickness of the plastic foil 100 and/or of the metal layers 108a, 108b may be selected so to facilitate correct forming of the integrated circuit 10.

FIGS. 2A to 6B are exemplary of possible manufacturing steps in one or more embodiments. In particular, Figures designated with letter "A" are exemplary (top) plan views of subsequent fabrication steps according to embodiments, and Figures designated with letter "B" are respective cross-sectional side views.

As exemplified in FIGS. 2A (top view) and 2B (side view), a (planar) plastic foil 100 may be provided as a core or substrate for a plastic leadframe 12. The plastic foil 100 may be shaped (e.g., by stamping or punching) to a "lead-frame-like" structure having center portions providing die mounting locations 102, with a plurality of lead-shaped portions extending away from each center portion, wherein said lead-shaped portions are spaced-apart from each other. The plastic foil 100 may comprise a material suitable for LDS processing.

As conventional in the fabrication of integrated circuits, in early steps of the fabrication flow the leadframe 12 may comprise a plurality of mounting locations 102 for a respective plurality of dies 104. The devices may be singulated (prior to or after molding of the molding material 110) by sawing or cutting along the sawing lines 200 indicated in FIG. 2A.

For the sake of clarity and ease of illustration, the following FIGS. 3A to 6B illustrate further steps of a manufacturing method according to embodiments with reference to only two adjacent mounting locations 102, i.e., a limited portion of the leadframe 12 such as portion 202 exemplified in FIGS. 2A and 2B.

As exemplified in FIGS. 3A (top view) and 3B (side view), the LDS-activatable material of the plastic foil 100 may be selectively activated by scanning laser radiation on the lead areas 300 of the leadframe 12. Laser radiation may be scanned on the front side and/or on the rear side of the foil 100, thereby providing laser-activated regions 100a and/or 100b, respectively, corresponding to the lead areas 300. The laser-activated regions 100a and/or 100b may extend in depth for about 5 μm to 10 μm in thickness from the surface(s) of the foil 100.

Once the selected areas 300 of the plastic leadframe 12 have been laser-activated, the selected areas 300 may be covered with a metallic layer (e.g., by electroless plating) as exemplified in FIGS. 4A (top view) and 4B (side view) to provide the metal layers 108a and/or 108b.

Alternatively, the laser-activated regions 100a, 100b may provide sufficient electrical conductivity and may not involve a surface metallization 108a, 108b.

Alternatively, the plastic material of the foil 100 may not comprise LDS-activatable material. In such a case, the fabrication step exemplified in FIGS. 3A, 3B may be skipped and the metal layers 108a and/or 108b may be selectively formed at the lead areas 300 of the foil 100 by resorting to standard masking techniques (e.g., physical masking or photoresist).

It will be appreciated that, in one or more embodiments, the plastic foil 100 may not be stamped or punched to provide physically separated lead areas 300, insofar as the leads may be electrically insulated one from the other by properly selecting the areas of the plastic foil 100 to be laser-activated and/or covered with metal.

Once the metal layers 108a and/or 108b are formed on the lead areas 300, the fabrication flow of the integrated circuit 10 may comprise conventional steps such as attaching dies 104 at the respective die mounting locations 102 (e.g., by means of soft-solder attach material) and wiring the die pads of the dies 104 to the respective leads provided on the plastic leadframe 12 (e.g., the metallic formations 108a), as exemplified in FIGS. 5A (top view) and 5B (side view).

As exemplified in FIGS. 6A (top view) and 6B (side view), a molding compound 110 (e.g., epoxy molding compound, EMC) may be provided to encapsulate the dies 104 attached to the leadframe 12 prior to or after a singulation step of the devices 10 (e.g., sawing along lines 200).

In one or more embodiments, after molding of the packages 110, the leadframe 12 may be further plated with an additional layer of metal (e.g., tin), trimmed, and formed (with such steps not visible in the Figures annexed herein).

In one or more embodiments as exemplified in FIG. 7, the lead areas 300 may be selected so as to reduce the complexity of wire bonding, e.g., by reducing (e.g., minimizing) the length of the bonding wires coupling the die pads to the leads, with such an improvement being facilitated by the flexibility of the LDS technique (or, in variant embodiments, of the masking technique) for patterning the lead areas 300.

Figure 8:
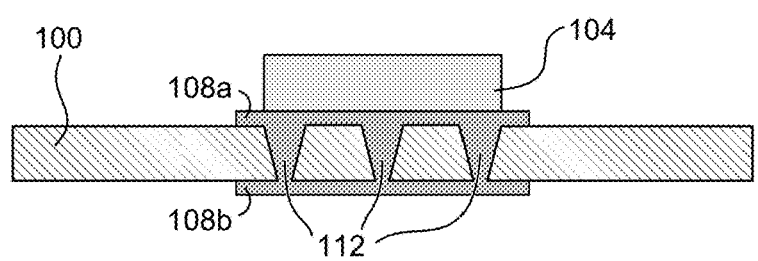
FIG. 8 is a cross-sectional view of certain elements of a semiconductor device exemplary of embodiments.

In one or more embodiments as exemplified in FIG. 8, the metal layers 108a, 108b may be provided also at the die pad area (or mounting location 102), e.g., by laser-activating those areas during the laser activation step exemplified in FIGS. 3A and 3B. The top metal layer 108a and the bottom metal layer 108b provided at the mounting locations 102 may be thermally coupled by fabricating one or more thermal vias 112 which extend through the thickness of the plastic foil 100, with such thermal vias possibly fabricated by laser direct structuring.

Figure 9A:
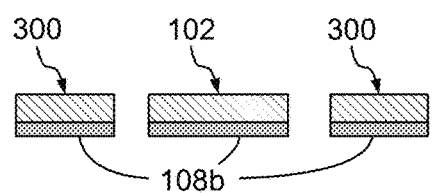
FIGS. 9A to 9D are exemplary of possible manufacturing steps according to embodiments.
Figure 9B:
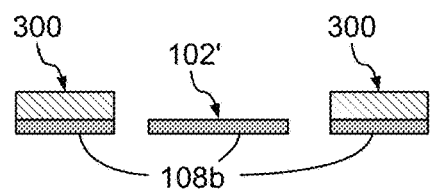
Figure 9C:
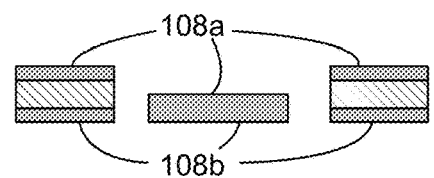
Figure 9D:
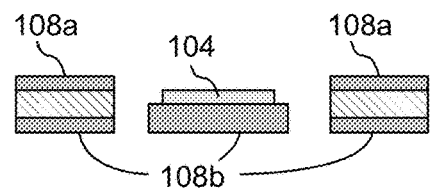

Alternatively, as exemplified in FIGS. 9A to 9D, the plastic foil 100 may be selectively removed at the mounting locations 102 to improve thermal dissipation from the die 104 during operation. For instance, a method according to embodiments may comprise:
  forming a metallic layer 108b on the rear side of the plastic foil 100 at the lead areas 300 and at the mounting locations 102 (FIG. 9A),
  selectively removing the plastic foil 100 at the mounting locations 102, thereby leaving exposed a metallic die pad 102' (FIG. 9B),
  forming a metallic layer 108a on the front (e.g., top) side of the plastic foil 100 at the lead areas 300 and on the front (e.g., top) side of the metallic die pad 102' (FIG. 9C), and
  attaching a die 104 at the metallic die pad 102' (FIG. 9D).

One or more embodiments may thus offer one or more of the following advantages:
  possibility of replacing the metallic leadframe with a less expensive plastic leadframe,
  providing high flexibility of routing to simplify wire bonding inside the body of the package 110, and
  providing low cost package for small outline integrated circuit (SOIC) old devices running in high volumes.

As exemplified herein, a method of manufacturing semiconductor devices (e.g., 10) may comprise:
  providing a plastic material substrate (e.g., 100) having at least one die mounting location (e.g., 102) for a semiconductor die (e.g., 104),
  forming (e.g., plating) metallic traces (e.g., 108a, 108b) on selected areas (e.g., 300) of said plastic material substrate, wherein said metallic traces provide electrically-conductive paths (e.g., lines) for coupling to said semiconductor die,
  attaching said semiconductor die onto said at least one die mounting location,
  bonding said semiconductor die attached onto said at least one die mounting location to selected ones of said metallic traces formed on the plastic material substrate,
  molding package material (e.g., 110) onto said semiconductor die attached onto said at least one die mounting location.

As exemplified herein, said plastic material substrate may comprise laser direct structuring material, and forming metallic traces on selected areas of said plastic material substrate may comprise laser activating said laser direct structuring material.

As exemplified herein, a method may comprise applying laser radiation energy to said laser direct structuring material at said selected areas of said plastic material substrate to provide activated regions of said plastic material substrate, and plating (e.g., by electroless plating) electrically-conductive material onto said activated regions of said plastic material substrate.

As exemplified herein, a method may comprise selectively forming said metallic traces on said selected areas of said plastic material substrate by applying a masking layer on said plastic material substrate.

As exemplified herein, a method may comprise providing (e.g., plating) a further metallic layer on portions of said selected areas left exposed by said package material, wherein said further metallic layer preferably comprises tin.

As exemplified herein, a method may comprise forming (e.g., plating) metallic areas (e.g., 108a, 108b) at said at least one die mounting location of said plastic material substrate prior to attaching onto said at least one die mounting location said respective at least one semiconductor die.

As exemplified herein, a method may comprise:
  forming a first metallic area (e.g., 108b) on a rear (e.g., bottom) surface of said plastic material substrate at said at least one die mounting location,
  forming a second metallic area (e.g., 108a) on a front (e.g., top) surface of said plastic material substrate at said at least one die mounting location, and
  providing thermal vias thermally coupling said first metallic area and said second metallic area through said plastic material substrate.

As exemplified herein, a method may comprise selectively removing said plastic material substrate at said at least one die mounting location prior to attaching onto said at least one die mounting location said respective at least one semiconductor die.

As exemplified herein, a method may comprise:
  forming a first metallic area on a rear surface of said plastic material substrate at said at least one die mounting location,
  selectively removing said plastic material substrate at said at least one die mounting location,
  forming a second metallic area on said first metallic area at said at least one die mounting location,
  attaching said at least one semiconductor die onto said second metallic area at said respective at least one die mounting location.

As exemplified herein, a thickness of said plastic material substrate may be in the range of 80 μm to 150 μm.

As exemplified herein, a thickness of said metallic traces may be in the range of 50 μm to 150 μm.

As exemplified herein, a semiconductor device may comprise:
  a plastic material substrate having a die mounting location for a respective semiconductor die,
  metallic traces formed on selected areas of said plastic material substrate, wherein said metallic traces provide electrically-conductive paths for coupling to said semiconductor die,
  a semiconductor die attached onto said die mounting location via die attach material, the semiconductor die bonded to selected ones of said metallic traces formed on the plastic material substrate,
  package material molded onto said semiconductor die attached onto said die mounting location (102).

Without prejudice to the underlying principles, the details and embodiments may vary, even significantly, with respect to what has been described by way of example only, without departing from the extent of protection.

The claims are an integral part of the technical teaching provided herein in respect of the embodiments.

The extent of protection is defined by the annexed claims.

The invention claimed is:

1. A semiconductor device, comprising:
    a plastic substrate patterned to have a leadframe shape including a plastic die mounting location and a plurality of plastic leads;
    metallic traces of activated laser direct structuring material at selected areas of said plurality of plastic leads;
    plating on the metallic traces to provide electrically-conductive paths;
    a semiconductor die attached at said plastic die mounting location;
    electrical bonding between the semiconductor die and selected ones of said electrically-conductive paths; and
    package material molded onto said semiconductor die attached onto said plastic die mounting location and a portion of said plurality of plastic leads.

2. The semiconductor device of claim 1, further comprising at least one metallic area at said plastic die mounting location, wherein said semiconductor die is attached to the at least one metallic area.

3. The semiconductor device of claim 2, wherein said at least one metallic area comprises:
    a first metallic area on a rear surface of said patterned plastic substrate at the plastic die mounting location;
    a second metallic area on a front surface of said patterned plastic substrate at said plastic die mounting location; and
    thermal vias extending through the plastic die mounting location to thermally couple said first metallic area to said second metallic area.

4. The semiconductor device of claim 2, wherein said at least one metallic area comprises:
    a metallic area on a rear surface of said patterned plastic substrate at said plastic die mounting location;
    an opening in said patterned plastic material substrate at said plastic die mounting location which expose said metallic area; and
    wherein said semiconductor die is attach onto said exposed metallic area.

5. The semiconductor device of claim 1, wherein a thickness of said plastic material substrate is in a range of 80 μm to 150 μm.

6. The semiconductor device of claim 1, wherein a thickness of said metallic traces is in a range of 50 μm to 150 μm.

7. The semiconductor device of claim 1, wherein a portion of said plurality of plastic leads extends externally out from a peripheral edge of the molded package material and wherein a portion of the electrically-conductive paths are present on said portion of said plurality of plastic leads.

8. A semiconductor device, comprising:
    a plastic material substrate patterned to have a leadframe shape including a die pad with a die mounting location and a plurality of plastic leads extending away from said die pad, wherein said plastic material substrate is formed of a laser direct structuring material;
    a semiconductor die attached onto said die mounting location via die attach material;
    metallic traces formed on selected areas of said plastic material substrate, wherein said metallic traces comprise activated laser direct structuring material at selected areas of said plurality of plastic leads;
    wire bonding of said semiconductor die to the metallic traces;
    wherein said metallic traces provide electrically-conductive paths for coupling to said semiconductor die; and
    package material molded onto said semiconductor die attached onto said die mounting location.

9. The semiconductor device of claim 8, wherein a portion of said plurality of plastic leads extends externally out from a peripheral edge of the molded package material and wherein a portion of the electrically-conductive paths are present on said portion of said plurality of plastic leads.

10. The semiconductor device of claim 8, wherein said metallic traces comprise activated laser direct structuring material at said die mounting location forming a metallic area of the plastic material substrate, and wherein said semiconductor die is attached to the metallic area.

11. The semiconductor device of claim 8, wherein said metallic traces comprise:
    activated laser direct structuring material at said die mounting location forming a first metallic area of said plastic material substrate on a rear surface of the die mounting location; and
    activated laser direct structuring material at said die mounting location forming a second metallic area of said plastic material substrate on a front surface of the die mounting location; and
    further comprising thermal vias extending through the plastic material substrate at the die mounting location to thermally couple said first metallic area to said second metallic area.

12. The semiconductor device of claim 8, wherein said metallic traces comprise activated laser direct structuring material at said die mounting location forming a metallic area of said plastic material substrate on a rear surface of said die mounting location;
    an opening from a front surface of said die mounting location extending through said patterned plastic material substrate to expose said metallic area; and
    wherein said semiconductor die is attach onto said exposed metallic area.

13. The semiconductor device of claim 8, further comprising plating on the metallic traces.

* * * * *